United States Patent
Denzler et al.

[11] Patent Number: 5,879,464
[45] Date of Patent: Mar. 9, 1999

[54] METHOD AND DEVICE FOR WET-PROCESSING SUBSTRATES IN A VESSEL

[75] Inventors: Ludwig Denzler, Keltern; Helmuth Harms-Janssen, Oberderdingen, both of Germany

[73] Assignee: Steag MicroTech GmbH, Pliezhausen, Germany

[21] Appl. No.: 952,708

[22] PCT Filed: May 2, 1996

[86] PCT No.: PCT/EP96/01813

§ 371 Date: Nov. 12, 1997

§ 102(e) Date: Nov. 12, 1997

[87] PCT Pub. No.: WO96/36068

PCT Pub. Date: Nov. 14, 1996

[30] Foreign Application Priority Data

May 12, 1995 [DE] Germany ............... 195 17 573.5

[51] Int. Cl.⁶ ................ B08B 3/04; C23G 1/00
[52] U.S. Cl. ............. 134/2; 134/25.4; 134/155; 134/186; 134/902; 68/208
[58] Field of Search .................. 134/2, 25.4, 155, 134/186, 902; 68/208

[56] References Cited

U.S. PATENT DOCUMENTS 4,722,752  2/1988  Steck ........................... 134/25.4

FOREIGN PATENT DOCUMENTS 208307   3/1960   Australia .
0385536  9/1990   European Pat. Off. .
0455465  11/1991  European Pat. Off. .

*Primary Examiner*—Zeinab El-Arini
*Attorney, Agent, or Firm*—Robert W. Becker & Associates

[57] ABSTRACT

A method and device for the wet processing of substrates in a container are provided. At least one liquid is introduced via at least one liquid inlet into the container. A liquid overflow device is adapted to float on the surface of the liquid in the container. The overflow device is provided with openings for withdrawing liquid from the container. Accompanied by release or flooding of the substrates disposed in the container, the overflow device, together with the surface of the liquid, drops to below the substrates or is raised from the substrates.

18 Claims, 1 Drawing Sheet

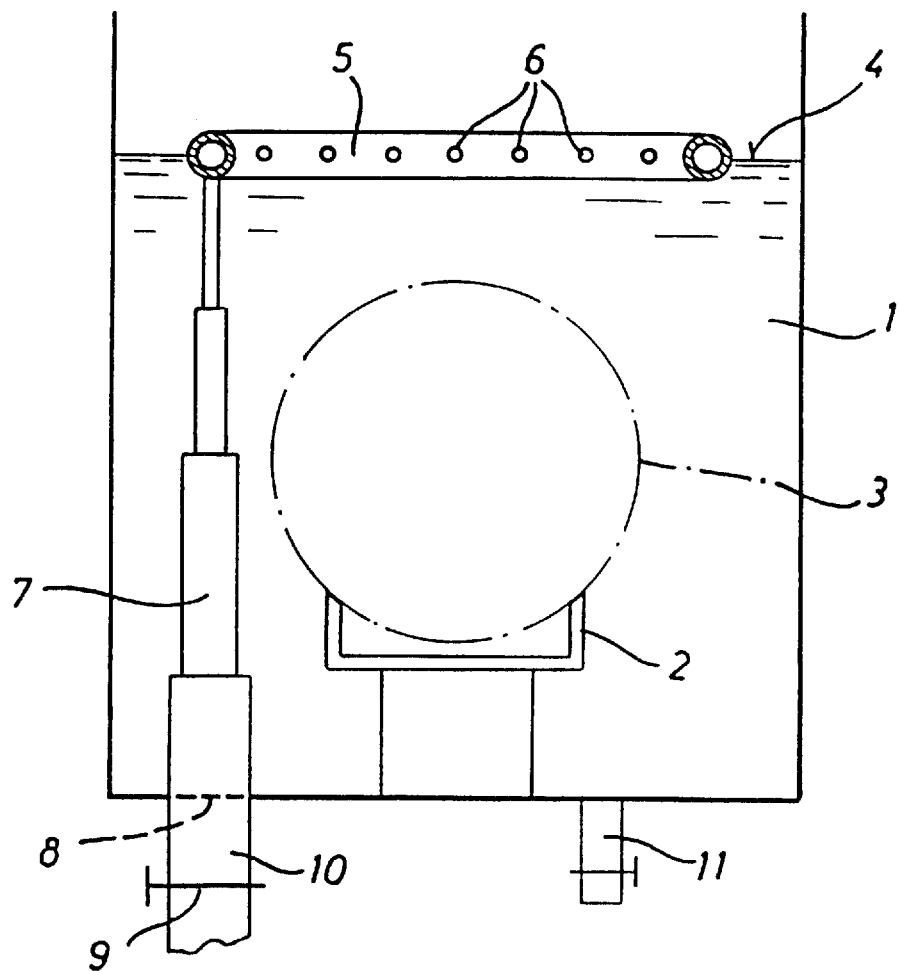

METHOD AND DEVICE FOR WET-PROCESSING SUBSTRATES IN A VESSEL

This is a national stage application of PCT/EP96/01813 filed May 2, 1996.

BACKGROUND OF THE INVENTION

The invention relates to a method for the wet treatment or processing of substrates in a container into which at least one fluid is introduced and drained via an overflow device. Furthermore, the invention relates to a device for the wet treatment of substrates in a container which is provided with at least one fluid inlet and one fluid overflow device with openings for draining a fluid.

Methods and devices of the above-mentioned kind are known, for example from U.S. Pat. No. 4,722,752, from EP A 0 385 536, and are also described in the unpublished documents DE-A-44 130 077 and DE-A-195 46 990 of the same applicant. The upper side of the container holding the fluid and the substrates is provided with overflow devices, whereby the fluid is introduced from below and upwardly, passing the substrates, and drains off through the overflow openings or edges at the upper side of the container. After the wet treatment, for example after a rinsing process, the substrates are lifted—by a more or less complicated mechanism—either together with a substrate carrier or directly out of the fluid or the container, with the overflow drain providing for particles and other contaminants at the fluid surface to be carried off into the overflow device by the flow and essentially not to stick to the substrates while lifting the substrates out of the fluid.

The mechanical devices for securely and uniformly lifting the substrates out of the fluid or out of the container are very costly and complicated. Moreover, the lifting mechanisms require a relatively large space within the container because they have to grip underneath the substrate carrier or under the substrates and lift them up. Apart from the fact that the container dimensions have to be relatively large, a relatively large fluid consumption is involved with this if the fluid has to be changed or replaced.

A particular disadvantage on lifting the wafers out of the container is also that very accurately manufactured guides for the wafers on the lifting mechanisms and within the hood for the wafers that is arranged above the container have to be formed in order to hold the wafers securely and reliably within a defined position during the lifting-off out of the container. The manufacturing costs for such guides are high because of the very precise manufacturing that is required and, additionally, with the commonly known devices damage or breaking of the substrates on lifting them out of the container can be avoided only by an additional adjusting mechanism.

AT 208 307 discloses a dosing apparatus for proportionally introducing chemical solutions into periodically charged containers. The dosing apparatus includes a chemical container that is hermetically sealed from the outside and that is disposed over a liquid or fluid container. Provided in the fluid container is an air-displacement bell that is opened downwardly toward the fluid container and at the highest location communicates via a connecting pipe with the hermetically sealed chemical container 1. Disposed in the interior of the sealed chemical container is a float with a tube, the free opening of which intersects the lower edge of the float. If the fluid container is entirely or partially filled, a corresponding quantity of air is displaced into the hermetically sealed chemical container, so that there exists in this sealed container an excess pressure that presses the chemical solution through the opening at the lower connecting end of the float, so that a corresponding quantity of chemical solution flows through a hose for the dosed introduction of the chemicals into the fluid container. Such a dosing apparatus enables the dosing of a fluid proportional to a fluid quantity that is to be filled in a liquid container by means of air displacement, so that this known apparatus serves a basically different purpose, entirely aside from the fact that the container for this purpose must be hermetically sealed in order to be able to generate an overpressure.

It is an object of the invention to provide or create a method and a device of the kind mentioned in the introduction which is substantially simpler not only with regard to the method but also to the structural requirements and, nevertheless, guarantees a secure and reliable handling of the substrates.

SUMMARY OF THE INVENTION

This object is resolved, according to the invention, in that the overflow device floats on the fluid and drops and/or lifts up together with the fluid surface for releasing or flooding the substrate disposed in the container.

In contrast to the conventional methods, the substrates are not lifted out of the fluid but the fluid gets lowered without changing the position of the substrates within the container. Since the overflow device according to the present invention floats on the fluid and is lowered together with the fluid surface, the particles and contaminants floating on the fluid surface are carried toward the overflow device by the flow, even when the fluid surface drops, and do not deposit on the substrates. Without the inventive overflow device floating on the fluid, the particles and contaminants would stick to the substrate surfaces on lowering the fluid surface and would contaminate the substrates again after the actual treatment or rinsing process.

The inventive method or the inventive device do not require lifting devices as do the conventional methods so that the devices required for the method can be manufactured substantially more simply and cost-efficiently. Moreover, the dimensions of the container are small so that the required fluid volume can also be kept low, which results in considerable savings in operating such wet treatment apparatus. Since it is not necessary to lift the substrates out of the container, there are also no guides necessary above the container, for example, within hoods, so that the inventive method can be carried out by very simple devices. Also, hoods are only required with this method in order to cover the processing chamber and to introduce a gas mixture. The treatment, e.g. drying of the substrates within the container itself, therefore is substantially more reliable and the danger of damaging the substrates does not exist.

According to an advantageous embodiment of the invention, the fluid flows via overflow openings of the overflow device and from there, via at least one pipe connected therewith, drains out of the container. After the fluids drain from the container, the substrates remain within the container and can then, in a simple way, for example as a unit together with a substrate carrier, be lifted out and be subjected to further treatment.

According to the invention, the object is also resolved by a device with which the overflow device is provided to be floatable and to be positioned on the fluid surface in which case the overflow device lowers and/or lifts together with the fluid surface. The advantages of the invention that were already described in connection with the inventive method, also apply to the inventive device.

The overflow device is provided with fluid drainage pipes which are connected with at least one container opening for draining the fluid. Advantageously, the at least one container opening is provided at the bottom of the container so that the fluid can drain without the additional use of a pump.

Since the overflow device floating on the fluid surface lowers and/or lifts together with the fluid, the fluid drainage pipe must be able to follow this movement. Advantageously, the fluid drainage pipe therefore is an elastic pipe, a corrugated pipe and/or a telescope-like retractable or extendable pipe. According to an alternative embodiment of the invention, the fluid drainage pipe is a pipe that is sealingly retractable and extendable through a container opening that is essentially formed at the bottom of the container.

The overflow device should, advantageously, surround the substrates so that a uniform fluid flow toward the outside is ensured that takes the particles and contaminants away from the substrates arranged within the overflow device even when the fluid surface is lowered. Therefore, the overflow device is advantageously a floatable ring surrounding the substrates. However, it is also possible to design the overflow device in its circumferential shape such that it essentially corresponds with the cross-sectional shape of the container interior. If the container interior, for example, is rectangular, the overflow device according to this embodiment of the invention is a rectangularly arranged pipe. The overflow device, be it ring-shaped or formed corresponding to the cross-sectional shape of the container interior, is advantageously guided within the container during lowering and/or lifting in order to ensure a defined position.

In order to ensure a flow that is as uniform as possible on the fluid surface from the inside toward the outside and away from the substrates toward the outside, it is advantageous to design the overflow openings to be evenly distributed along the circumference of the overflow device, for example in the shape of holes or slots within a ring or pipe.

According to a further embodiment of the inventive device, a detachable hood is provided above the container and is advantageously provided with a gas intake member in order to be able to take in gas for the drying process as it is described in connection with EP 0 385 536 A. The gas that is introduced via the gas intake member is advantageously withdrawn together with the draining treatment fluid via the overflow openings of the overflow device.

BRIEF DESCRIPTION OF THE DRAWING

In the following, the invention is described with the help of one embodiment with reference to a single, schematic cross-sectional drawing.

DESCRIPTION OF THE PREFERRED EMBODIMENTS

A receiving member 2 for substrates 3, for example, wafers arranged parallel to one another, is positioned on the container bottom within a container 1, for example a fluid treatment or rinsing tank. On the fluid surface 4, an overflow device 5 is floating which is, for example, formed in a ring shape and surrounds the substrates 3 without the overflow device 5 coming into contact with the substrates 3 when the fluid, and hence also the overflow device 5 that floats on the fluid surface 4 is lowered. The overflow device 5 is provided with openings 6 through which the fluid flows into a telescope pipe 7 which is connected at its lower end with an opening 8 within the container 1. The fluid thus drains out of the container 1 into a drainage pipe 10 that can be shut off by a shut-off member 9 and—if the same fluid volume is not correspondingly introduced into the container via an inlet tube 11—the overflow device 5 is lowered together with the fluid until it arrives at below the substrates 3. During the lowering procedure of the overflow device 5, the telescope pipe 7 retracts and thus shortens.

After lowering the overflow device 5 below the lowest edge of the substrates 3, these are exposed and they can be lifted either together with the receiving member 2 or a carrier arranged on the receiving member 2 or even individually out of the container in the usual way from above and subjected to further treatment.

By evenly distributing the overflow openings 6 the overflow device 5, a constant flow of the fluid from the inside toward the outside is achieved, i.e. away from the substrates 3 toward the outside, so that also particles and contaminants floating on the fluid surface 4 are carried away from the substrates 3 into the overflow device 5. The substrates 3, thus, stay free from particles and contaminants even when the fluid is removed from the container 1.

The invention was described above with the help of a preferred embodiment. However, numerous modifications and embodiments can be made by the expert without abandoning the basic idea of the invention. For example, the overflow device 5 can be designed in many different ways, for example, in the form of pipes in which the openings 6, in conformity with existing conditions, can be formed also at the outer circumferential surface. Instead of the telescopic pipe 7, it is also possible to use a corrugated pipe that folds up when the overflow device 5 is lowered.

The specification incorporates by reference the disclosure of German priority document PCT/EP96/01813 of May 2, 1996.

The present invention is, of course, in no way restricted to the specific disclosure of the specification and drawings, but also encompasses any modifications within the scope of the appended claims.

What we claim is:

1. A method for the wet treatment of substrates in a container, including the steps of:
    introducing into said container at least one liquid;
    providing an overflow device such that it floats on said liquid in said container; and
    by means of said overflow device withdrawing liquid and contaminants contained in said liquid from said container, whereby, accompanied by release or flooding of said substrates disposed in said container, said overflow device, together with a surface of said liquid, is adapted to drop to below said substrates or to be raised from said substrates.

2. A method according to claim 1, which includes the step of withdrawing liquid from said container by means of overflow openings of said overflow device as well as by means of at least one conduit means that communicates with said overflow device.

3. A device for the wet treatment of substrates in a container into which at least one liquid is introduced via at least one liquid inlet, comprising:
    a liquid overflow device that is adapted to float on a surface of said liquid in said container, said overflow device being provided with openings for withdrawal of liquid from said container, whereby, accompanied by release or flooding of said substrates disposed in said container, said overflow device, together with said surface of said liquid, is adapted to drop to below said substrates or to be raised from said substrates.

4. A device according to claim 3, wherein said openings of said overflow device are liquid overflow openings.

5. A device according to claim 3, wherein said overflow device is provided with liquid drain means.

6. A device according to claim 5, wherein said container is provided with at least one container opening, and wherein said liquid drain means comprises at least one liquid drain line that provides communication between said overflow device and said at least one container opening.

7. A device according to claim 6, wherein said container opening is provided on a bottom of said container.

8. A device according to claim 6, wherein said liquid drain line is an elastic hose.

9. A device according to claim 6, wherein said liquid drain line is a corrugated hose.

10. A device according to claim 6, wherein said liquid drain line is a telescopic tube.

11. A device according to claim 6, wherein said liquid drain line is a pipe that is sealingly retractable and extendable through said at least one container opening.

12. A device according to claim 4, wherein said overflow device is a floatable ring that surrounds said substrates.

13. A device according to claim 4, wherein said overflow device has a circumferential shape that corresponds to a cross-sectional shape of the interior of said container.

14. A device according to claim 4, which includes means for guiding said overflow device in said container during a dropping or raising movement of said overflow device.

15. A device according to claim 4, wherein said overflow openings are uniformly distributed over the periphery of said overflow device.

16. A device according to claim 4, which includes a hood that is disposed over said container and can be opened and closed.

17. A device according to claim 4, which includes a gas inlet device.

18. A device according to claim 17, wherein said overflow opening of said overflow device also serve as a gas outlet device.

* * * * *

UNITED STATES PATENT AND TRADEMARK OFFICE
CERTIFICATE OF CORRECTION

PATENT NO. : 5,879,464
DATED : 3/9/99
INVENTOR(S) : Ludwig Denzler and Helmuth Harms-Janssen It is certified that error appears in the above-identified patent and that said Letters Patent is hereby corrected as shown below:

Title page, item [54], and column 1, lines 1 & 2,

-- METHOD AND DEVICE FOR THE WET PROCESSING
   OF SUBSTRATES IN A CONTAINER --.

Title page item [30], Priority Data insert -- PCT/EP96/01813 Europe 2 May 1996--.

Signed and Sealed this

Twenty-first Day of December, 1999

Attest:

Q. TODD DICKINSON

*Attesting Officer*           *Acting Commissioner of Patents and Trademarks*